United States Patent [19]

Raso

[11] Patent Number: 5,041,745
[45] Date of Patent: Aug. 20, 1991

[54] FAILSAFE BANDPASS FILTER/DECODER
[75] Inventor: Frank A. Raso, Spencerport, N.Y.
[73] Assignee: General Signal Corporation, N.Y.
[21] Appl. No.: 591,394
[22] Filed: Oct. 1, 1990
[51] Int. Cl.⁵ ........................... H03K 5/00; H03H 7/00
[52] U.S. Cl. ..................... 307/520; 307/521; 328/167; 333/172; 333/174
[58] Field of Search ................ 307/520, 521; 328/167; 333/167, 172, 174

[56]  References Cited
U.S. PATENT DOCUMENTS

| | | | |
|---|---|---|---|
| 3,532,908 | 10/1970 | Jennings | 307/521 |
| 3,725,802 | 4/1973 | Darrow | 333/172 |
| 3,946,328 | 3/1976 | Boctor | 307/521 |
| 4,001,710 | 1/1977 | Darrow | 333/172 |
| 4,016,517 | 4/1977 | Sahasrabudhe et al. | 333/186 |
| 4,290,027 | 9/1981 | Parker | 333/172 |
| 4,368,440 | 1/1983 | Darrow | 333/172 |

Primary Examiner—Stanley D. Miller
Assistant Examiner—Toan Tran
Attorney, Agent, or Firm—John F. Ohlandt

[57] ABSTRACT

A failsafe bandpass filter/decoder system comprising: an active bandpass filter which comprises a high-pass filter section having selected resistors which can only decrease in value during a failure mode and, in series with the high-pass filter section, a low-pass filter section having selected resistors which can only increase in value during a failure mode, whereby under any failure mode, the pass band of the filter will be reduced; and a level detector having an upper threshold voltage trip point and a lower threshold voltage trip point, both trip points having to be exceeded by the input wave form to produce a proper (square wave) output.

12 Claims, 4 Drawing Sheets

PRIOR KNOWLEDGE

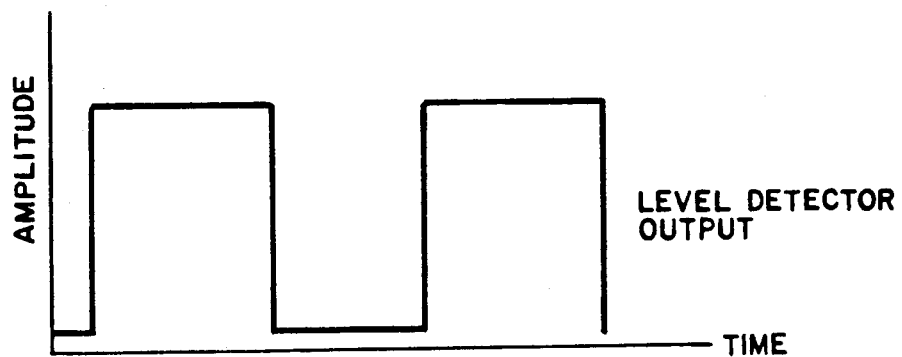
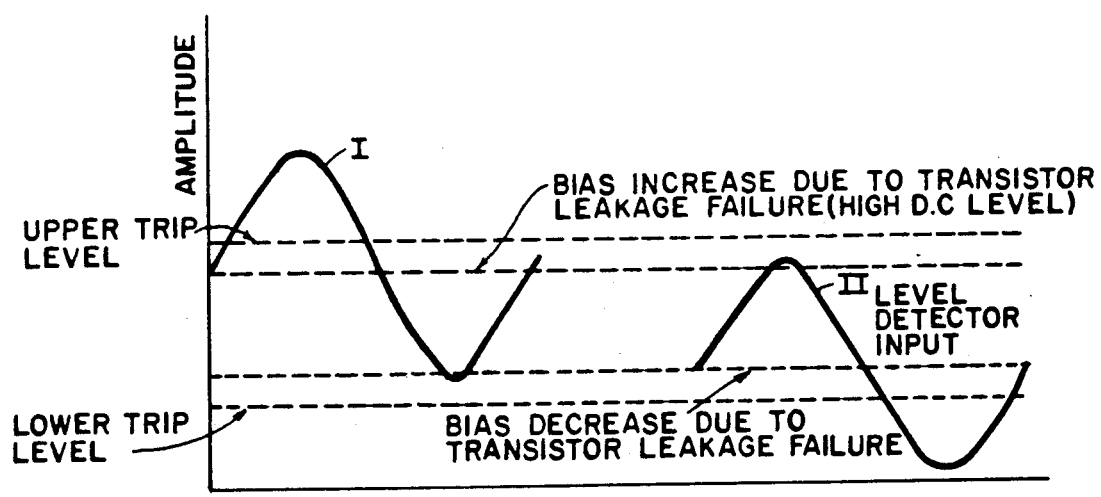

FAILSAFE BANDPASS FILTER/DECODER

The present invention relates to a novel failsafe bandpass filter/decoder system for use in various signal and communication systems, such as those used in railway operations. This novel system comprises an active bandpass filter having a high-pass filter with resistors which can only decrease in value during a failure mode and a low-pass filter with resistors which can only increase in value during a failure mode, and a level detector comprising an upper threshold voltage trip point and a lower threshold voltage trip point.

BACKGROUND OF THE INVENTION

In various types of signal and communication systems for use in railroad and mass and/or rapid transit operations, it is customary practice to employ cab signals to control the speed of a vehicle or train as it moves along its route of travel. Normally, the cab signals which are received on board the vehicle or train are in the form of coded carrier waveforms. That is, the carrier signal is selectively coded or modulated by one of a plurality of code or pulse rates. Each code or pulse rate signifies or represents a given maximum speed or velocity at which a vehicle or train is permitted to travel along any given block or section of the track. In actual operation, the coded carrier signals are normally conveyed to the track rails by a transmitter connected thereto and are picked up by inductive receiver coils which are mounted forward of the front axle of the lead vehicle or locomotive. The picked up signals are amplified, demodulated, shaped, and filtered, and then the recovered signals are applied to the speed command decoding unit.

In typical speed control systems for railroad as well as mass and/or rapid transit operations, a speed command decoding unit has been carried on the vehicle involved. For example, in a cab signaling speed control system, the cab signals are received from the rails and are applied to the cab signaling receiver for processing. By comparing the decoded speed command signal with the actual vehicle speed signal produced by an axle driven generator, it is possible to determine whether a vehicle is proceeding at the appropriate authorized speed for any given section of track. In such operations, it is mandatory that any overspeed condition be immediately detected and that the necessary measures, such as braking, be instituted to correct the situation. A further requirement of such operation is that under no circumstance should a critical circuit or component failure simulate a true condition. Thus, every vital circuit including filter circuits of the vehicle-carried speed command decoding unit must operate in a failsafe fashion; that is, the electronic filter should not be capable of passing signals having frequencies substantially different from those of a band of signals adjacent a preselected frequency.

In other control systems applicable to railroad operations, the objective has been simply to provide a coded control signal indicative of the presence of a train or other vehicle in a given track section along the right of way, where different code rates are used in different track sections. In these control systems, a decoding scheme has also been deployed.

In the past, passive series resonant circuit decoders were often used as the frequency selective element in vehicle-carried decoding units and train detection units. FIG. 1, attached hereto, depicts a commonly used passive series resonant circuit decoder 10 wherein a code is input into decoder driver 12 and relay driver 14, which send an output signal to a relay. Due to the fact that the frequencies are quite low, e.g., 1.25 to 21.5 Hz, the capacitors (C) and particularly the inductors (L) are very large, heavy and expensive. In addition to the resonant circuit, a decoder driver 12 with sufficient drive capability is needed to drive the circuit. This drive circuit may be a medium power transistor driver circuit or any other suitable arrangement, such as code following relay driving a master step-up transformer which is used as the input to the series resonant circuit.

Accordingly, it is a primary object of the present invention to replace the previously noted components with an all electronic decode system which is much smaller and less costly.

There have been various attempts to overcome the disadvantages of the large, heavy, and expensive passive series resonant decoders. Most prominent amongst the alternative devices are the active bandpass filters. Examples of active bandpass filters used in decoding railway signals can be found in the following U.S. Pat. Nos.: 4,001,710 (Darrow), issued Jan. 4, 1977; 4,290,027 (Parker), issued Sept. 15, 1981; 3,725,802 (Darrow), issued Apr. 3, 1973; and 4,368,440 (Darrow), issued Jan. 11, 1983.

U.S. Pat. No. 4,001,710 discloses a low frequency selective amplifier circuit having a feedback loop including an R-C twin-T network which is imperfectly nulled to a particular frequency and having an emitter follower for isolating the series resistance branch of the R-C twin-T network from the load of the selective amplifier circuit so that an output signal is produced when and only when an input signal having the particular frequency is present and no critical component or circuit failure exists.

U.S. Pat. No. 4,290,027 discloses an active bandpass filter circuit comprising a first section including a twin-T filter network, a power source connected to the twin-T network, a second section including a first resistor connected between a common or reference point and the input of the twin-T network, and a second, feedback resistor connected from the output to the input of the twin-T network such that the loop gain is less than one.

U.S. Pat. No. 3,725,802 discloses an electronic filter circuit including a feedback amplifier. The feedback path of the amplifier includes a twin-T network which is imperfectly nulled to only provide regeneration at a preselected frequency so that an output signal is only available during the presence of a signal having the preselected frequency and in the absence of a critical component or circuit failure.

U.S. Pat. No. 4,368,440 discloses a low-pass filter employing a selected one of a plurality of transistor gates and switches for establishing a circuit path from a source of AC signals to the low-pass filter and for determining an upper frequency signal passing limit for the low-pass filter. This circuit also includes a four terminal timing capacitor.

Most conventional active bandpass filters typically use operational amplifiers with feedback for the active filter which are very difficult to make failsafe due to changes in gain or oscillations caused by the various failure modes which may occur. The active element for these filters is normally a unity gain amplifier, which under the wrong failure mode could increase its gain. This could cause oscillations or change the filter response so that it might pass a code rate frequency that is outside of its normal bandpass.

The present invention provides a failsafe decoder system which includes passive components having failure modes that will cause the filter to fail in the safe direction. Furthermore, the novel active bandpass filter includes high-pass and low-pass filters connected in series which individually can only fail in such a way as to reduce the band of frequencies which may pass therethrough during component failure. The active bandpass filter is connected to a level detector which is also failsafe. The level detector produces a proper output only if both an upper and a lower threshold voltage is crossed, which is dependent upon appropriate D.C. bias existing in the filter.

It should be noted that the combination of an electronic high-pass and low-pass filter has been known. For example, such a combination has been employed in musical applications. (See U.S. Pat. No. 3,475,623 (Moog), issued Oct. 28, 1969). However, it will be appreciated that this patent, as well as others, have no application to railway speed control decoders or the like.

The present invention also provides many additional advantages which shall become apparent as described below

SUMMARY OF THE INVENTION

In fulfillment of the above-noted objects and to obtain the desired advantages, a primary feature of the present invention resides in a failsafe bandpass filter/decoder system comprising: an active bandpass filter which comprises a high-pass filter section having resistors so selected that they can only decrease in value in a failure mode, and, in series with said high-pass filter section, a low-pass filter section having resistors so selected that they can only increase in value in a failure mode, whereby any change in the band of frequencies passed in the event of component failure can only be in the decreasing direction; and a level detector having an upper threshold voltage trip point and a lower threshold voltage trip point.

The level detector is one which produces a proper output only if the detected voltage waveform exceeds both the upper threshold voltage trip point and the lower threshold voltage trip point; whereby the output from the decoder system is a square wave. This level detector has been used in other railroad applications requiring fail safe detection; namely in the ATP module for L.A. SCRTD and CLEVELAND CTA. The upper/lower trip level safe detection has also been used in two General Railway Signal track circuit modules which use microprocessors: TRACKKODE and GENRAKODE.

Other and further objects, advantages and features of the present invention will be understood by reference to the following specification in conjunction with the annexed drawings, wherein like parts have been given like numbers.

BRIEF DESCRIPTION OF THE DRAWING

FIG. 5B is a graph of the waveform for the level detector output corresponding to the input shown in FIG. 5A;

FIG. 6A is a graph of several waveforms (I and II) for a level detector input when the bias increases or decreases respectively due to transistor leakage failure;

DESCRIPTION OF THE PREFERRED EMBODIMENTS

The novel decoder system of the present invention comprises a failsafe bandpass filter followed by a failsafe level detector. To be failsafe any filter failure must not decrease the stop band attenuation of the filter so as to pass an adjacent, substantially different, frequency code rate. Stated another way, the band of frequencies being passed must not increase.

Figure 1:
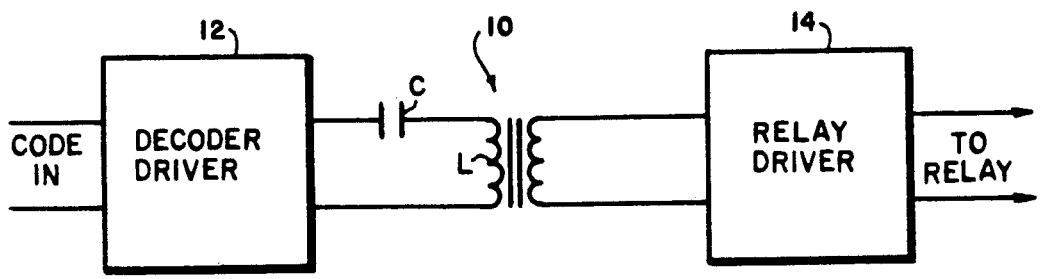
FIG. 1 is a block diagram of a conventional passive series resonant circuit system.
Figure 2:
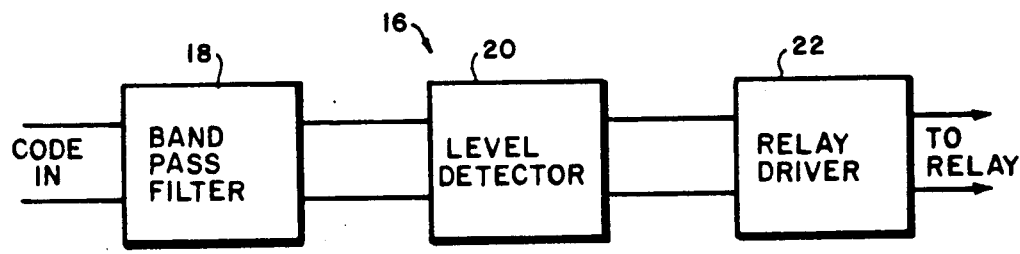
FIG. 2 is a block diagram of a failsafe bandpass filter/decoder system according to the present invention.
Figure 4:
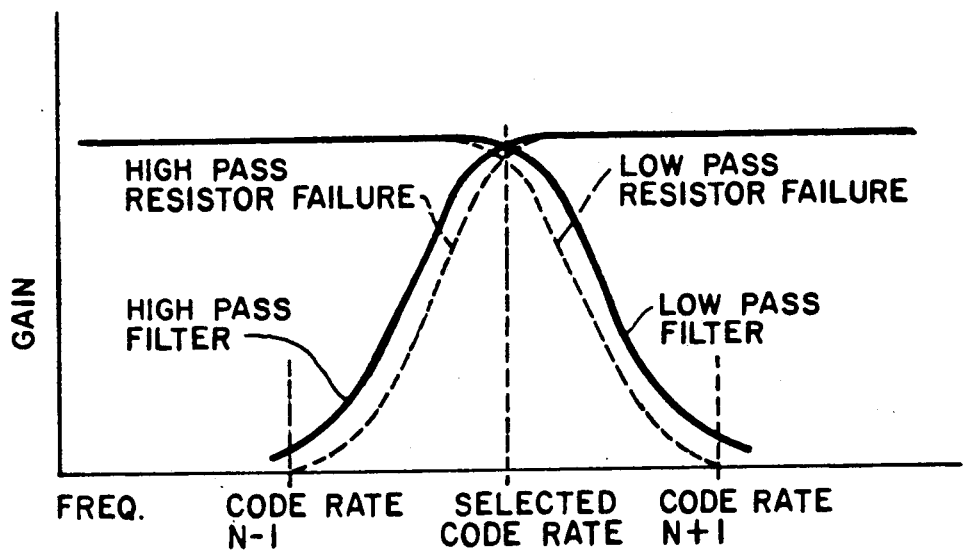
FIG. 4 is a graph plotting gain versus frequency and demonstrates the effect of high-pass resistor failure and low-pass resistor failure.
Figure 5A:
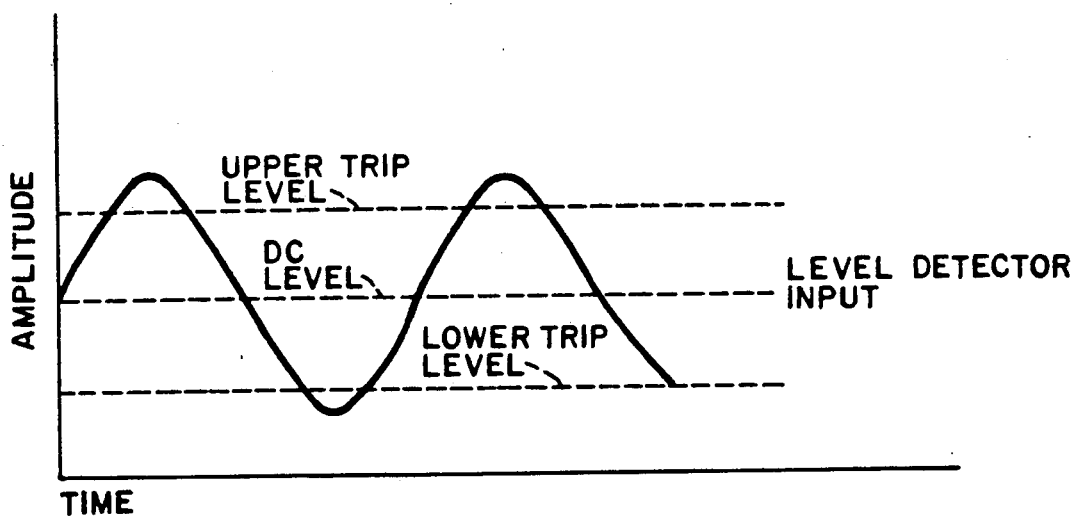
FIG. 5A is a graph of the waveform for a level detector input.

FIG. 2 depicts the preferred decoder system according to the present invention wherein a decoder system 16 comprises an active bandpass filter 18 having a high-pass filter with resistors which can only decrease in value in a failure mode and a low-pass filter with resistors which can only increase in value in a failure mode; a level detector 20 having an upper threshold voltage trip point and a lower threshold voltage trip point; and, optionally, a relay driver 22. A code of appropriate frequency is fed to bandpass filter 18, having been developed in equipment not shown, which functions to compare signals representative of actual speed of a vehicle with signals picked up from the wayside which represent permitted speed. The code is filtered by bandpass filter 18 and then sent to level detector 20. The input speed or track signal will be at the proper, i.e. selected, code rate, or within the permissible band as seen in FIG. 4, regardless of any failure within the bandpass filter. If no failure exists within the level detector 20 (FIG. 5A), the output thereof will be a square wave, as seen in FIG. 5B. The square wave is then sent to relay driver 22 which, depending upon the signal received, signals the relay to apply the brakes of the locomotive.

Figure 3:
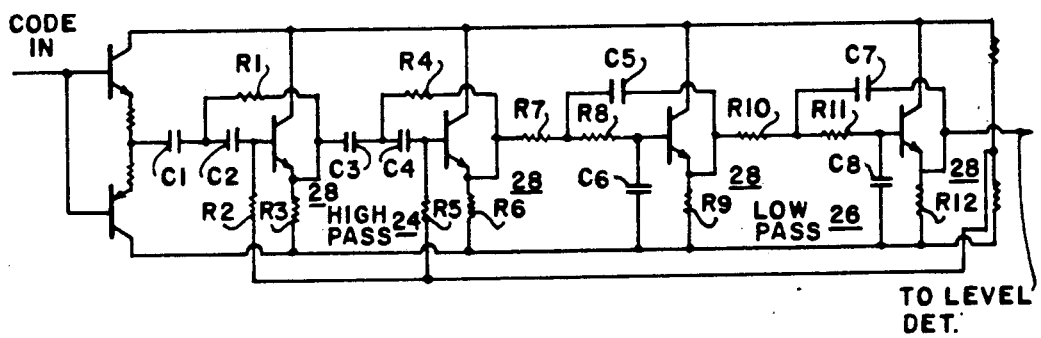
FIG. 3 is a schematic representation of the bandpass filter circuit according to the present invention.

As shown in FIG. 3, the preferred bandpass filter 18 includes a high-pass filter, or filter section, 24, and low-pass filter, or filter section, 26 connected in series. Bandpass filter 18 uses emitter followers 28 which have a gain slightly less than unity and cannot increase above unity under any failure mode. The preferred emitter follower is one which will also not oscillate in a failure mode.

Bandpass filter 18 typically uses four poles for each of the filter sections; that is, high-pass section 24 comprises a pair of 2 pole stages in the form of emitter followers; likewise, for low-pass section 26. However, the exact number of poles used is determined by the bandpass characteristics desired. The passive components are selected from those having failure modes that would cause filter 18 to fail in the safe direction.

Opens in capacitors C1, C2, C3, C4, C5, C6, C7, and C8 will be self evident failures. Each of the capacitors used in bandpass filter 18 are preferably film capacitors.

High-pass filter 24 determines the low frequency end of the bandpass and low-pass filter 26 determines the high pass end of the bandpass. In order to maintain a failsafe condition during resistor failure, the resistors in the high-pass filter section 24, i.e. R1, R2, R4, and R5 are selected to be wirewound resistors which can only decrease in value in a failure mode. Since resistors R1, R2, R4, and R5 can only decrease in value during a resistor failure, they ensure that the low frequency end of the bandpass filter will increase in frequency thus decreasing the pass band for the low frequencies.

Resistors R7, R8, R10, and R11 used in low-pass filter 26 are selected to be metal film resistors, which can only increase in value in a failure mode. Since resistors R7, R8, R10, and R11 can only increase in value during a resistor failure, they ensure that the high frequency end of the bandpass filter will decrease in frequency, thus also decreasing the pass band for the high frequencies, thereby making bandpass filter 18 completely failsafe due to passive component failure.

Resistors R3, R6, R9, and R12 are simply DC current return emitter resistors that do not affect the frequency response of the filter and may be any type resistors.

FIG. 4 shows the frequency response of the bandpass filter as determined by the high-pass and low-pass filters connected in series. The solid line in each case is the normal response, while the dotted line represents what occurs when the components fail, i.e., the pass band decreases.

Bandpass filter 18 is followed by a failsafe level detector 20 which produces a proper output (square wave) only if both an upper and a lower threshold voltage is crossed. The upper and lower threshold detection accomplishes two primary objectives as shown in FIG. 5A. Since the output from decoder system 16 must be a square wave, a conventional single-ended detector would be useless, because it would only produce a pulse whose width depends on how high above the threshold the detector input signal is. The level detector 20 is a dual-ended detector, which by having both upper and lower threshold detection produces a square wave, as shown in FIG. 5B, with the leading edge of the positive half of the cycle produced by the upper threshold voltage trip point and the trailing edge produced by the lower threshold voltage trip point.

Figure 6B:
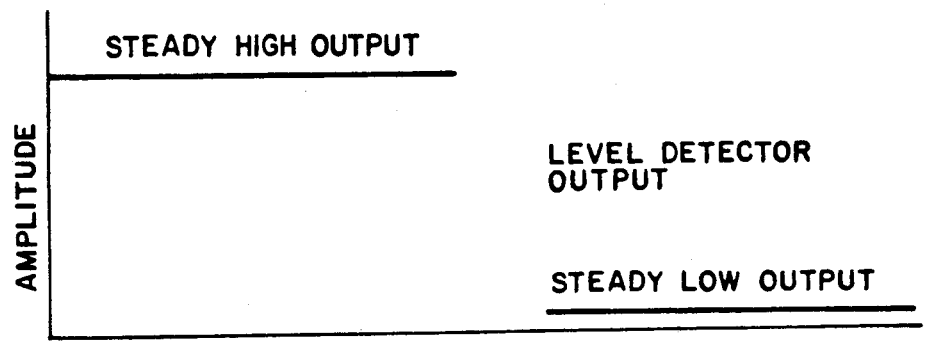
FIG. 6B is a graph of several waveforms for level detector outputs corresponding to the respective input waveforms shown in FIG. 6A.

The second objective, demonstrated in FIGS. 6A and 6B, is to ensure that bandpass filter 18 is failsafe in the event of transistor failures which could cause the DC level of the input of level detector 20 to shift and thus detect the lower output level of the stop band frequencies. Level detector 20 produces a proper output, as seen in FIG. 5B, only if the peak-to-peak signal amplitude exceeds both the upper and lower threshold voltage trip points. The failsafe relay driver 22 requires an AC signal to pull in the relay. If the DC level increases the lower threshold voltage trip point is not crossed (waveform I in FIG. 6A), which will give a steady DC high level output (FIG. 6B); and if the DC level decreases (waveform II in FIG. 6A), the upper threshold voltage trip point is not crossed giving a steady low DC level output (FIG. 6B).

Figure 7:
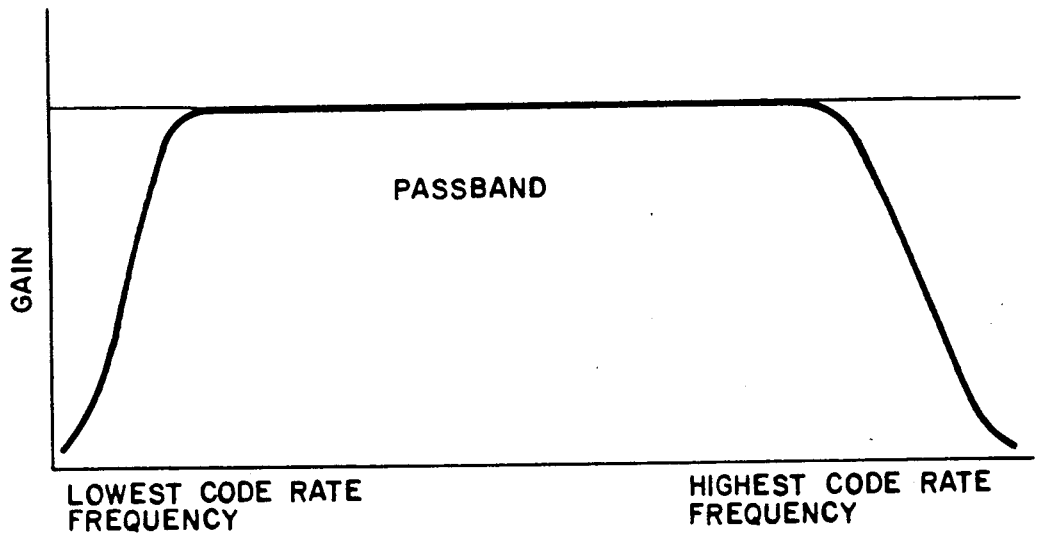
FIG. 7 is a graph plotting gain versus frequency for the bandpass of an all code rate filter.

Alternatively, the decoder system of the present invention may be used as an "all code rate" decoder where a range of code rate frequencies are used to drive the relays such as in Single Code ATP track circuits. In an "all code rate" decoder the bandpass filter increases the noise immunity of the decoder. The low end of the bandpass would be set to the lowest code rate frequency used and the high end of the bandpass would be set to the highest code rate frequency used as shown in FIG. 7.

While I have shown and described several embodiments in accordance with my invention, it is to be clearly understood that the same are susceptible to numerous changes apparent to one skilled in the art. Therefore, I do not wish to be limited to the details shown and described but intend to show all changes and modifications which come within the scope of the appended claims.

What is claimed is:

1. A failsafe bandpass filter/decoder system comprising:
   an active bandpass filter which comprises a high-pass filter section having resistors which can only decrease in value during a failure mode and, in series with said high-pass filter section, a low-pass filter section having resistors which can only increase in value during a failure mode; and
   a level detector connected to said active bandpass filter having an upper threshold voltage trip point and a lower threshold voltage trip point.

2. The decoder system according to claim 1, wherein said system also includes a relay driver.

3. The decoder system according to claim 1, wherein said level detector is one which can produce a proper output only if a voltage is detected by both said upper threshold voltage trip point and said lower threshold voltage trip point; whereby the output from said decoder system is a square wave.

4. The decoder system according to claim 1, wherein said active bandpass filter include emitter followers which have a gain slightly less than unity and cannot increase above unity under any failure mode.

5. The decoder system according to claim 4, wherein said emitter followers are capable of not oscillating in a failure mode.

6. The decoder system according to claim 1, wherein said high-pass filter and said low-pass filter includes passive components which fail in a safe direction.

7. The decoder system according to claim 6, wherein the resistors of said high-pass filter section are wirewound resistors.

8. The decoder system according to claim 6, wherein the resistors of said low-pass filter section are metal film resistors.

9. The decoder system according to claim 6, further including film capacitors in said active bandpass filter.

10. The decoder system according to claim 1, wherein said high-pass filter section determines the low frequency end of the bandpass and said low-pass filter section determines the high frequency end of the bandpass.

11. The decoder system according to claim 10, wherein a decrease in value of the resistors contained in said high-pass filter results in an increase in said low frequency end of said bandpass filter, thus causing the pass band of frequencies to decrease.

12. The decoder system according to claim 10, wherein an increase in value of the resistors contained in said low-pass filter section results in a decrease in said high frequency end of said bandpass filter, thus causing the pass band of frequencies to decrease.

* * * * *